United States Patent
Lee et al.

(10) Patent No.: US 7,054,896 B2
(45) Date of Patent: May 30, 2006

(54) METHOD FOR IMPLEMENTING A MULTIPLIER-LESS FIR FILTER

(75) Inventors: I-Hsien Lee, Kaohsiung (TW); Cheng-Shing Wu, Miaoli (TW); An-Yeu Wu, Taipei (TW)

(73) Assignee: Industrial Technology Research Institute, Hsinchu (TW)

(*) Notice: Subject to any disclaimer, the term of this patent is extended or adjusted under 35 U.S.C. 154(b) by 685 days.

(21) Appl. No.: 10/230,142

(22) Filed: Aug. 29, 2002

(65) Prior Publication Data

US 2003/0204545 A1    Oct. 30, 2003

Related U.S. Application Data

(60) Provisional application No. 60/375,835, filed on Apr. 29, 2002.

(51) Int. Cl.
*G06F 17/10* (2006.01)

(52) U.S. Cl. ..................................... 708/319

(58) Field of Classification Search ............. 708/319
See application file for complete search history.

(56) References Cited

U.S. PATENT DOCUMENTS

| | | | | |
|---|---|---|---|---|
| 3,914,588 A | * | 10/1975 | Nussbaumer | 708/319 |
| 4,862,402 A | * | 8/1989 | Shah et al. | 708/315 |
| 5,717,726 A | * | 2/1998 | Herrmann et al. | 375/350 |
| 6,590,931 B1 | * | 7/2003 | Wittig | 375/231 |

OTHER PUBLICATIONS

Sumant Ramprasad, Naresh R. Shanbhag; Member, IEEE, and Ibrahim N. Fellow, IEEE; "Decorrelating (DECOR) Transformations For Low-Power Digital Filters"; pp. 776-778; IEEE Transactions On Circuits And System II; Analog And Digital Signal Processing; vol. 46, No. 6, Jun. 1999.

Chao-Liang Chen, Student Member, IEEE and Alan N. Wilson Jr., Fellow, IEEE; "A Trellis Search Algorithm For The Design Of FIR Filters With Signed-Power-Of-Two Coefficients"; pp. 29-39; IEEE Transactions On Circuits And Systems—II; Analog And Digital Signal Processing; vol. 46, No. 1, Jan. 1999.

* cited by examiner

*Primary Examiner*—D. H. Malzahn
(74) *Attorney, Agent, or Firm*—Bacon & Thomas, PLLC

(57) ABSTRACT

A method for implementing a multiplier-less FIR filter is disclosed, in which the FIR filter performs the convolution of $$H(z) = \sum_{k=0}^{N-1} h_k z^{-k},$$

where $h_k$ is the k-th coefficient of the FIR filter. The dynamic range of the filter coefficients is compressed by a transformation:

$$H'(z) = H(z) \frac{\prod_{i=1}^{m-1}(1+\alpha_i z^{-\beta})^m}{\prod_{i=1}^{m-1}(1+\alpha_i z^{-\beta})^m},$$

where parameters $\alpha$ and $\beta$ are chosen depending on filter type, $-1 \leq \alpha_i \leq 1$, and m denotes iteration numbers of coefficient operation of transformation, so as to avoid the serious quantization error caused by the phenomenon of SPT distribution. Then, the compressed coefficients are quantized into SPT numbers, and the coefficients are optimized by removing redundant STP numbers.

9 Claims, 8 Drawing Sheets

METHOD FOR IMPLEMENTING A MULTIPLIER-LESS FIR FILTER

CROSS-REFERENCE TO RELATED APPLICATION

This application claims priority of provisional application No. 60/375,835, filed on Apr. 29, 2002.

BACKGROUND OF THE INVENTION

1. Field of the Invention

The present invention relates to the technical field of finite impulse response filters (FIR) and, more particularly, to a method for implementing a multiplier-less FIR filter based on modified DECOR transformation and a trellis de-allocation scheme.

2. Description of Related Art

Conventionally, the finite impulse response (FIR) filter is one of the key functional blocks in many digital signal processing (DSP) applications. In time domain representation, an N-tap FIR filter performs the following convolution:

$$y[n] = \sum_{k=0}^{N-1} h_k x[n-k], \tag{1}$$

where $h_k$ is the k-th coefficient of the FIR filter; and x(n) and y(n) denote the input and the output signals at time instance n, respectively. Such a FIR filter architecture is shown in FIG. 1. As shown, the multiplicative operation is the fundamental function in the FIR filter structure, which may cause a severe problem because the array multiplier requires a large layout area and tremendous power consumption.

With reference to FIG. 5, there is shown a preferred embodiment of the method for implementing multipler-less FIR filters, which includes the steps of: (Step 1) compressing the dynamic range of filter coefficients into a smaller set; (Step 2) quantizing these pre-processed coefficients, which are generated by step 1, into SPT numbers; and (step 3) optimizing the coefficients by removing redundant SPT numbers.

In such a multiplier-less FIR filter implementation, the number of nonzero digits employed determines the cost of the FIR filter. Therefore, the increase of the number of nonzero digits will increase the hardware complexity. To avoid employing complicated hardware, it is desired to control the number of nonzero digits to be smaller than a predetermined value.

However, FIG. 2 demonstrates the distribution of 2-nonzero-digit SPT numbers between 0.0 and 1.0 for wordlength 7, 8, and 9, respectively As we can see, the gaps of the SPT distribution that exceed 0.5 cannot be reduced even if the wordlength of the SPT numbers increases. To achieve higher precision performance (reducing the gaps), we have to employ more non-zero digits. However, increasing the non-zero digit has the effect of increasing the number of adders in each filter tap.

In the known 1st-order differential coefficient method (DCM), equation (1) can be reformulated as follows:

$$y[n] = \sum_{k=0}^{N-1} (h_k - h_{k-1} + h_{k-1}) x[n-k] \tag{2}$$

$$= h_0 x[n] + \sum_{k=1}^{N-1} \delta_k^1 x[n-k] + y[n-1] - h_{N-1} x[n-N].$$

where $\delta^1_k \equiv h_k - h_{k-1}$. The "1st-order" operation denotes the difference between the contiguous coefficients is taken only once. The corresponding structure of the DCM-based FIR structure is depicted in FIG. 3, wherein the extra cost of the 1st-order DCM is one additional tap and one accumulator, as circled by the dotted line. For m-th-order DCM, the coefficients are generated by taking the difference of the (m−1) th-order DCM coefficients as $$\delta^m_{k-m/k} \equiv \delta^{m-1}_{k-m+1/k} - \delta^{m-1}_{k-m/k-1}. \tag{3}$$

The effectiveness of the DCM reduced the dynamic range of filter coefficient significantly as shown in FIG. 4. The reduction of dynamic range of FIR filter implies that the wordlength can be reduced.

An alternative representation for FIR filter in z-domain is given in Eq. (4). H(z) is named as the transfer function of the filter.

$$H(z) = \sum_{k=0}^{N-1} h_k z^{-k}. \tag{4}$$

From z-domain point of view, it is able to represent the first order DCM of the FIR filter as $$H'(z) = \frac{H(z)(1-z^{-1})}{(1-z^{-1})}, \tag{5}$$

where H(z) is the transfer function of original FIR filter. It can be seen that the transfer function is the same as long as the introduced term, $(1-z^{-1})$, is fully cancelled in both denominator and numerator of Eq. (5). Furthermore, this transformation equivalents to inserting a pole-zero pair on the real axis of z-plane with z=1. For m-th order DCM, m pairs pole and zero are located on the same position. In addition, Eq. (5) can be generalized to the DECOR transformation, in which the transfer function is rewritten as $$H'(z) = H(z) \frac{(1+\alpha z^{-\beta})^m}{(1+\alpha z^{-\beta})^m}. \tag{6}$$

The parameters of α and β are chosen depending on the filter type, and m denotes the order (iteration numbers of coefficient operation) of DECOR as listed in Table 1. As known, following DECOR transformation can reduce the coefficient dynamic range in all kinds of FIR filter.

TABLE 1

| Filter Type | α | β | F(z) |
|---|---|---|---|
| Low-pass | −1 | 1 | $(1 - z^{-1})^m$ |
| High-pass | 1 | 1 | $(1 + z^{-1})^m$ |
| Band-pass($\omega_c$: center frequency) | 1 | $\pi/\omega_c$ | $(1 - z^{-\pi/\omega_c})^m$ |
| Band-stop | −1 | 2 | $(1 - z^{-2})^m$ |

In the design of FIR filter based on the SPT term, quantizing the coefficient after DECOR transformation will encounter the stability problem. Therefore, quantization must be held before DECOR transformation.

This procedure ensures that DECOR based FIR filter can be implemented by shift-and-add operation instead of array multiplier. However, it results in a serious coefficient quantization problem since the filter coefficient may exceed 0.5. Quantizing these coefficients and then transferring them into a smaller dynamic range only helps reduce wordlength but not quantization error. As a result, a DCM and DECOR based FIR filter still needs more nonzero terms to prevent serious quantization problem in quantizing larger coefficients. Therefore, it is desired for the discussed FIR filter to be improved, so as to migrate and/or obviate the aforementioned problem.

SUMMARY OF THE INVENTION

It is one object of the present invention to provide a method for implementing a multiplier-less FIR filter which can avoid the serious quantization error caused by non-uniform distribution of SPT numbers.

As we can see in FIG. 2, most of the values that can be represented under limited nonzero terms are crowded in the region with a smaller value. Coefficient quantization error can be avoided if all of the filter coefficients to be quantized only exist in this region. As a consequence, we would like to compress the dynamic range of filter coefficient before SPT quantization so as to avoid the serious quantization problem. And this is the main concept of this invention in providing a method for implementing a lower cost multiplier-less FIR filter since we do not need additional adder to compensate serious quantization error.

To achieve the objects, there is provided a method for implementing a multiplier-less FIR filter that performs the convolution of $$H(z) = \sum_{k=0}^{N-1} h_k z^{-k},$$

where $h_k$ is the k-th coefficient of the FIR filter. The method comprises the steps of: (A) compressing the dynamic range of filter coefficients by a transformation:

$$H'(z) = H(z) \frac{\prod_{i=1}^{m-1}(1+\alpha_i z^{-\beta})^m}{\prod_{i=1}^{m-1}(1+\alpha_i z^{-\beta})^m},$$

where parameters α and β are chosen depending on filter type, $-1 \leq \alpha_i \leq 1$, and m denotes iteration numbers of coefficient operation of transformation; and (B) quantizing the compressed coefficients obtained in step (A) into SPT numbers.

The coefficients generated by step (A) and step (B) could be the combination of hundreds of SPT terms. Some of these SPT terms are redundant, which means removing these SPT terms will not affect filter performance seriously. Hence, another object of this invention is further optimizing filter coefficients so as to achieve lowest cost. The proposed optimization procedure finds an efficient way to choose the SPT terms that can be dropped with little performance degradation.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
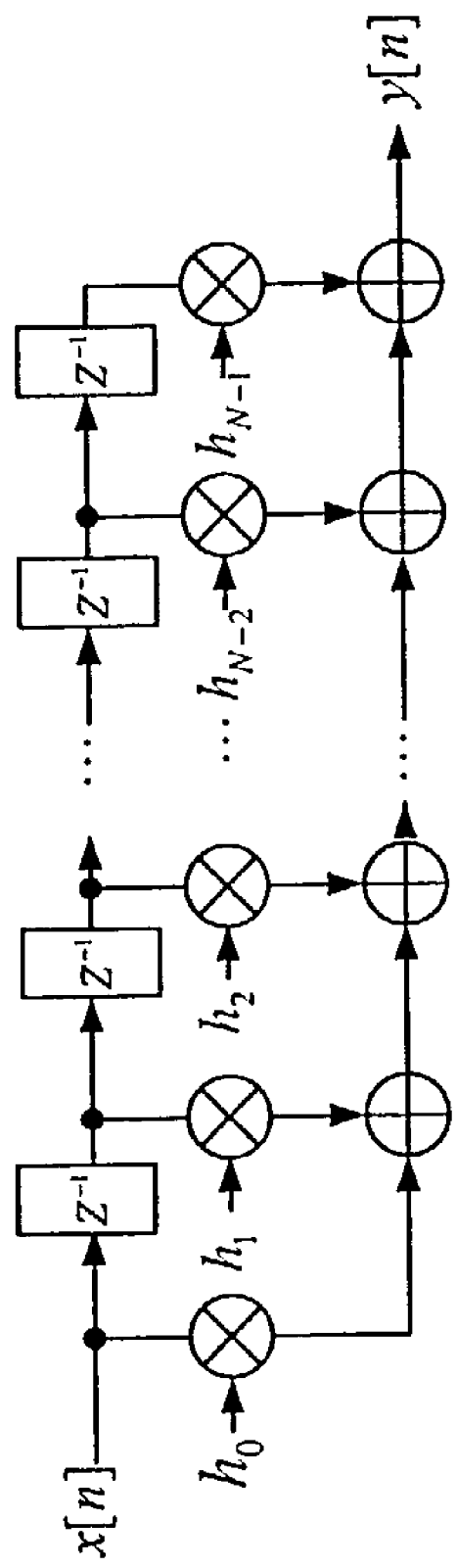
FIG. 1 shows a conventional FIR filter architecture.
Figure 2:
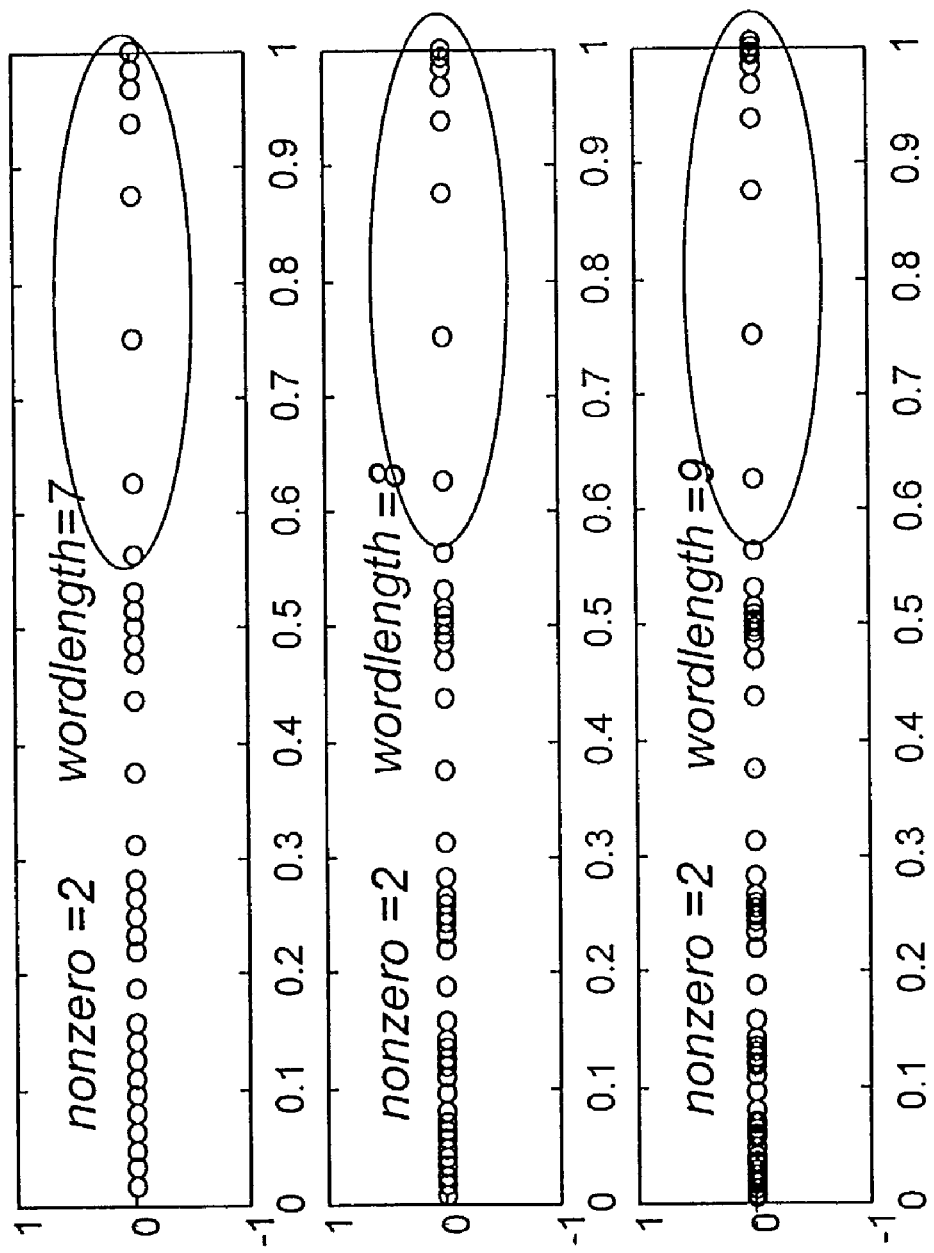
FIG. 2 shows the distribution of SPT numbers.
Figure 3:
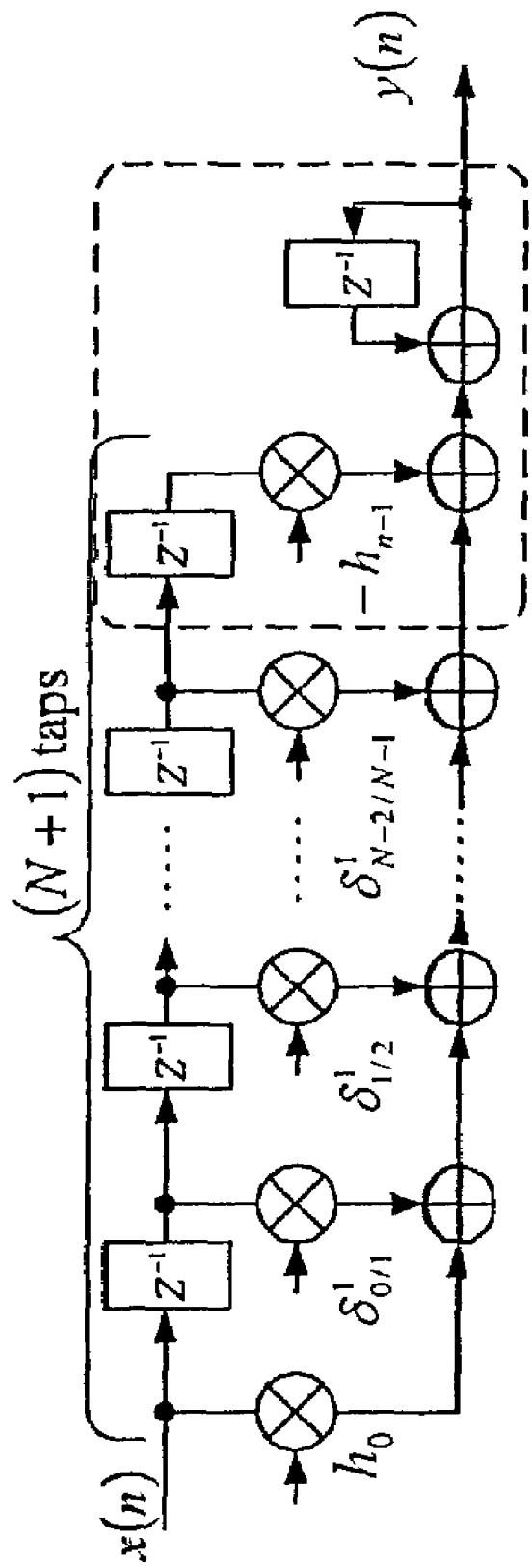
FIG. 3 shows a DCM-based FIR structure.
Figure 4:
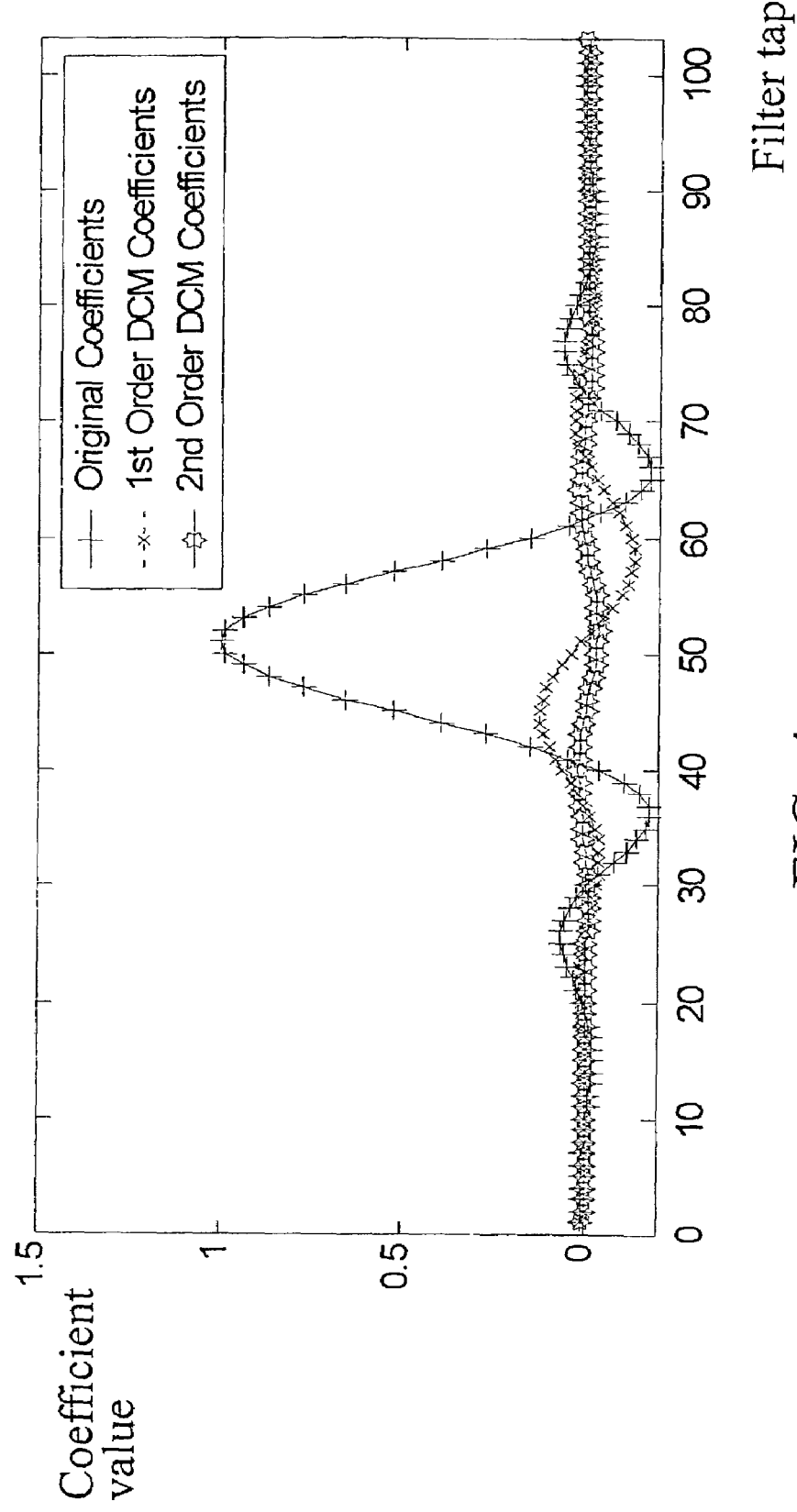
FIG. 4 shows the effectiveness of the DCM in significantly reducing the dynamic range of filter coefficient.
Figure 5:
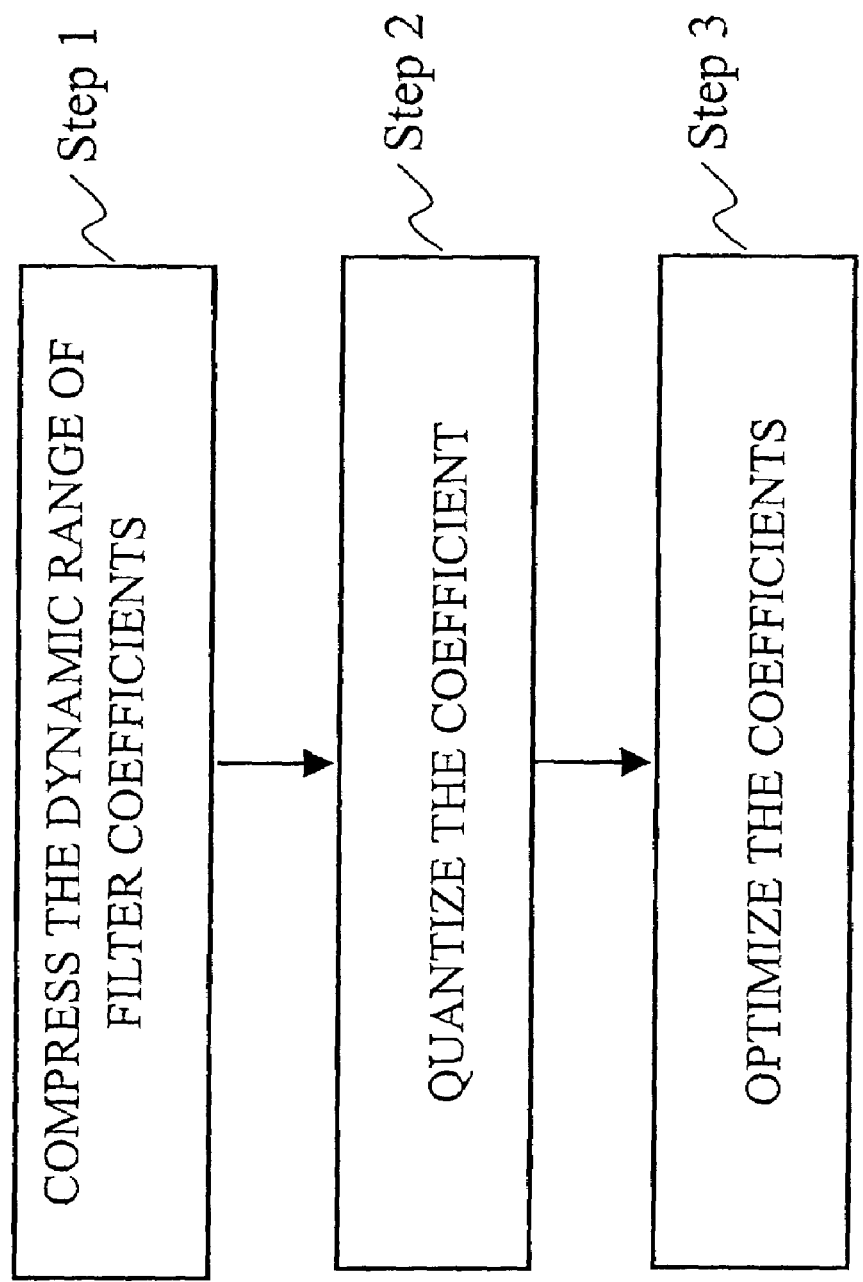
FIG. 5 shows a flowchart of the method for implementing a multiplier-less FIR filter in accordance with the present invention.

With reference to FIG. 5, there is shown a preferred embodiment of the method for implementing multiplier-less FIR filters, which includes the steps of: (Step 1) compressing the dynamic range of filter coefficients into a smaller set; (Step 2) quantizing these pre-processed coefficients, which are generated by step 1, into SPT numbers; and (Step 3) optimizing the coefficients by removing redundant STP numbers.

In step 1, a Modified DECOR (MDECOR) transformation is employed to compress the dynamic range of the filter coefficients. The transfer function of the m-th order MDECOR is represented as $$H'(z) = H(z) \frac{\prod_{i=1}^{m-1}(1+\alpha_i z^{-\beta})^m}{\prod_{i=1}^{m-1}(1+\alpha_i z^{-\beta})^m}. \tag{7}$$

where parameter $\alpha_i$ has the constraint $-1 \leq \alpha_i \leq 1$. Note that the value of parameter β and sign of $\alpha_i$ are still determined depending on filter types listed Table 1. However, the value of $\alpha_i$ can be chosen as an arbitrary value with absolute value less than or equals to 1.

Figure 6:
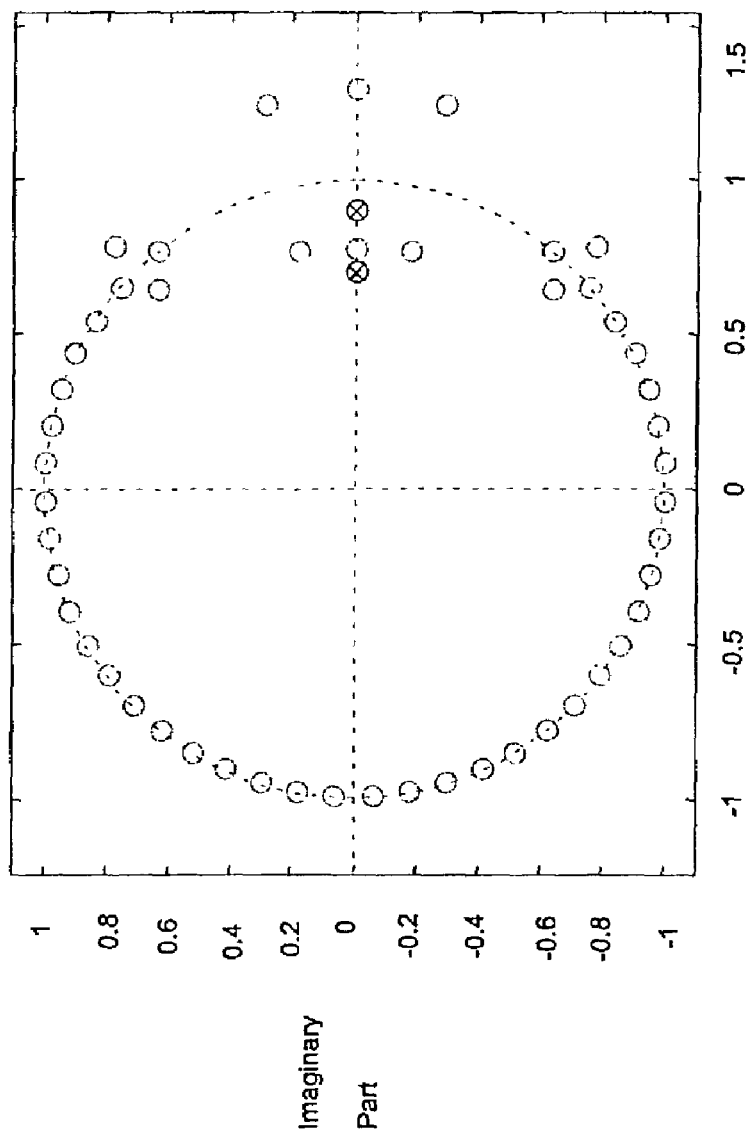
FIG. 6 illustrates that different values of $\alpha_i$ are assigned to optimize filter performance in the m-th order MDECOR transformation.

With this MDECOR transformation, the poles in Eq. (7) will not cause serious distortion even if the zeros drift away from the original location, furthermore, different values of $\alpha_i$ can be assigned to optimize filter performance in teh m-th order MDECOR transformation as shown in FIG. 6.

This phenomenon high flexibility in coefficient compressions, which means a smaller dynamic range of filter coefficient can be expected. As we mentioned above, the quantization error can be eased if the coefficient to be quantized has a smaller value. That implies MDECOR suffers less error due to the high compression ability in choosing various value of $\alpha_i$. This enables the MDECOR based FIR filter to be realized with a lower hardware complexity since there is no need to additional nonzero terms to solve serious quantization problem. Hence, a better frequency response and Signal-to-Quantize Noise Ratio (SQNR) performance can be expected. Suppose that it is desired to implement a FIR filter by SPT multipliers but the performance cannot satisfy the specification under limited numbers of non-zero digits. The present MDECOR can be employed to achieve the target precision performance, instead of using more adders in practical implementation. Hence, a lower cost can be achieved.

After performing step 1, the multiplier-less FIR filter is provided with compressed coefficients, denoted as h(1), h(2), h(3), . . . h(n). In step 2, these pre-processed coefficients are quantized into SPT numbers. Assumed that there are four compressed coefficients h(1), h(2), h(3), and h(4), the following quantization is given as an example:

h(1)=$-2^{-4}$, h(2)=$-2^{-4}-2^{-6}$, h(3)=$-2^{-4}-2^{-8}$, and h(4)=$2^{-7}$.

After performing step 2, the filter coefficients have been transformed by MDECOR algorithm and quantized into SPT numbers, whereby a multiplier-less filter can be realized to meet the filter specification. However, the processed (includes transformation and quantization) coefficients may contain some redundant SPT terms since the filter specification issue is not considered in the aforementioned steps. As a consequence, removing some SPT terms in the processed coefficients will not degrade frequency response seriously and also will satisfy the filter specification assigned by the filter designer.

In step 3, a trellis de-allocation procedure is employed to optimize the coefficients. Basically, the trellis de-allocation is the modified version of known trellis allocation algorithm. The trellis allocation can be proposed to add successive SPT terms, one at a time, to the filter that benefits the filter's frequency response most. This manner will be terminated until the best filter encountered meets the design specification. The trellis de-allocation algorithm, as well as trellis allocation algorithm, selects the SPT term that can benefits filter's frequency response most in each stage. However, the trellis de-allocation removes the selected SPT term instead of adding it in the previous stage. Such a trellis de-allocation includes the following steps:

(Step 3-1) Initialization

Figure 7:
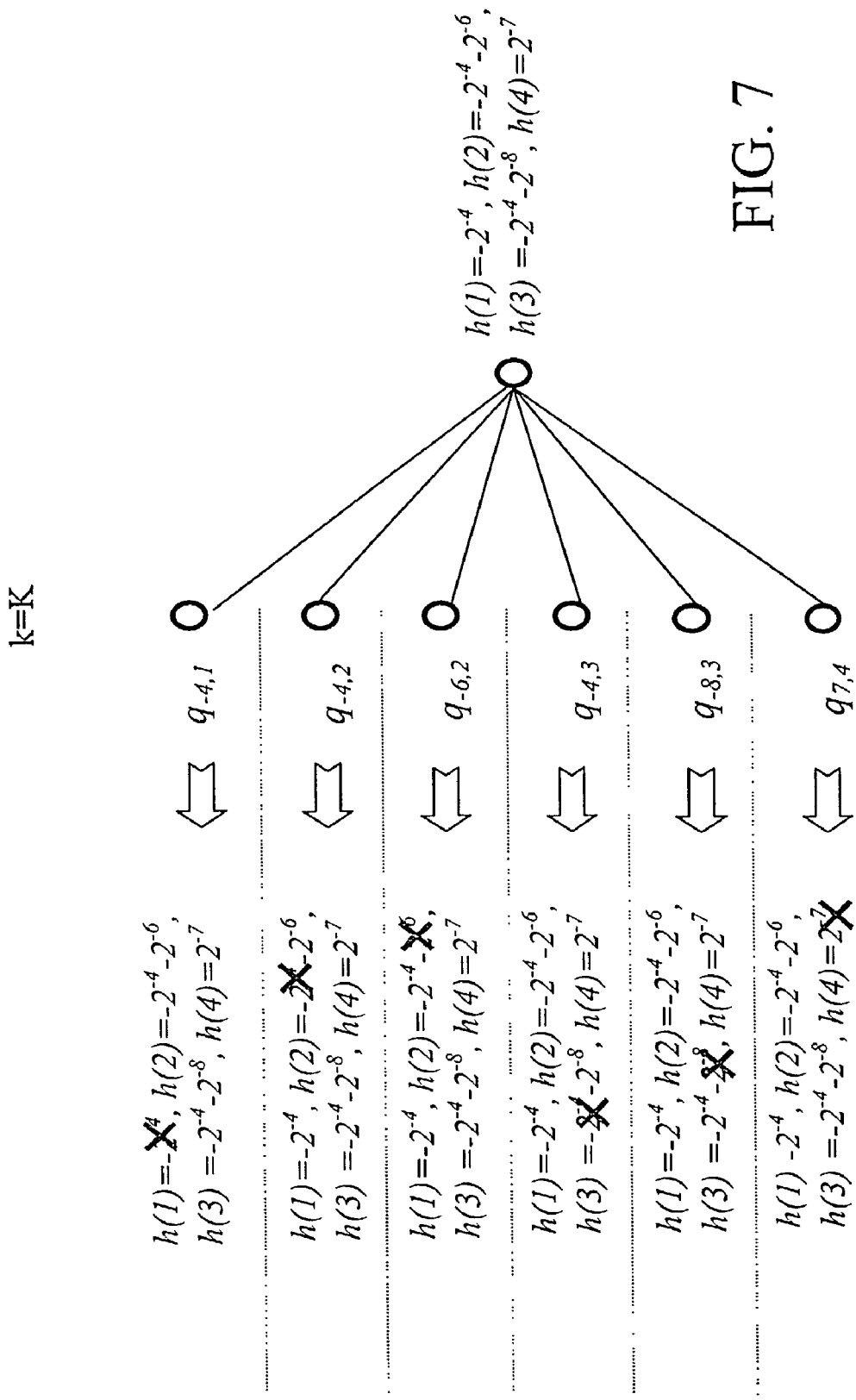
FIG. 7 schematically illustrates the initialization and SPT term removing steps in the trellis de-allocation.

In the first stage of trellis de-allocation, all SPT terms of the coefficients are allocated. As shown in FIG. 7, the allocated SPT terms are: h(1)=$-2^{-4}$, h(2)=$-2^{-4}-2^{-6}$, h(3)=$-2^{-4}-2^{-8}$, and h(4)=$2^{-7}$. In the k=K stage, all SPT terms, $q_{-4,1}$, $q_{-4,2}$, $q_{-6,2}$, $q_{-4,3}$, $q_{-8,3}$ and $q_{7,4}$ are listed as candidates to be removed, wherein $q_{x,y}$ denotes that there is a $2^{-|x|}$ in the y-th coefficient, and the sign of x denotes the addition/subtraction of the operation.

(Step 3-2) De-Accumulation

Figure 8:
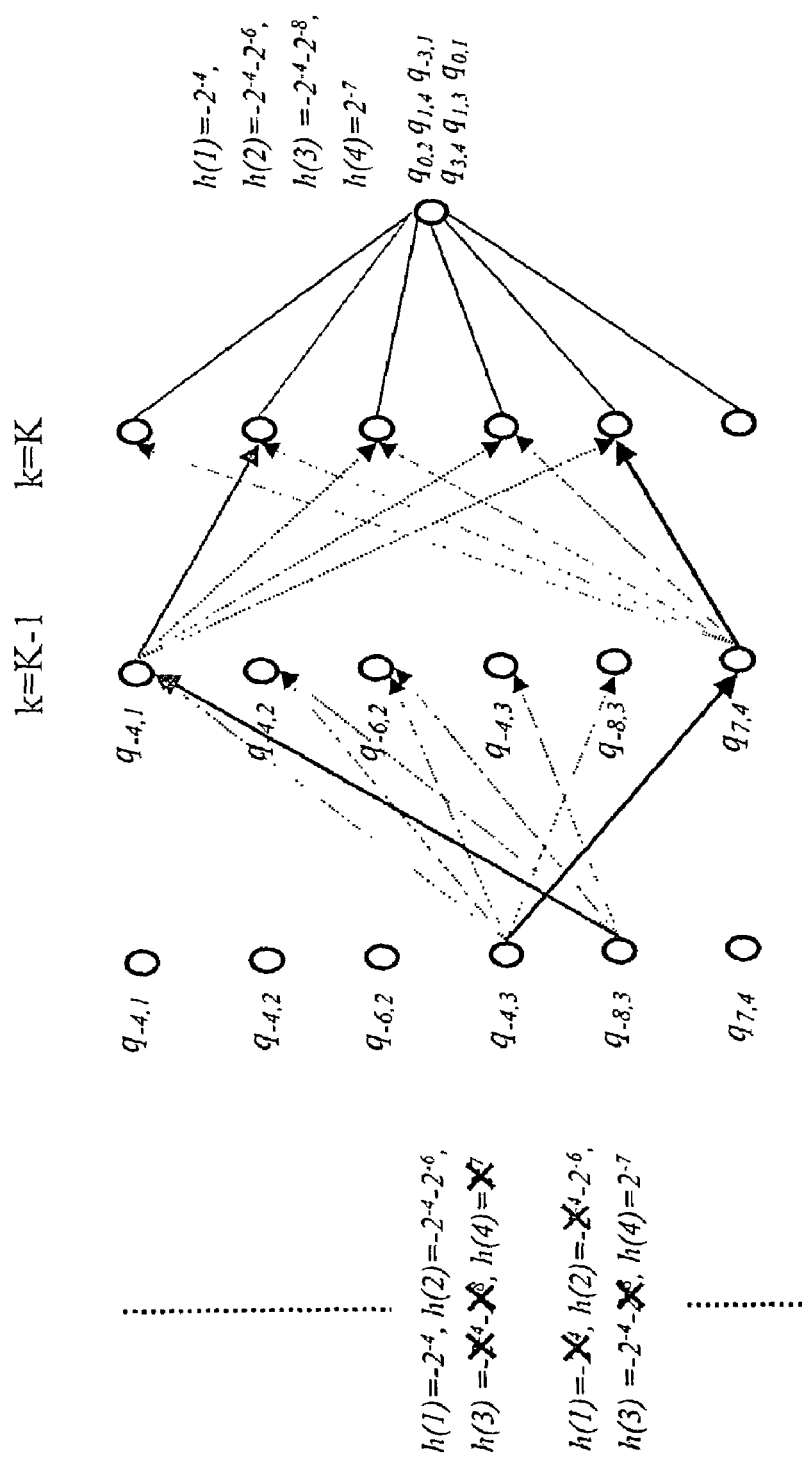
FIG. 8 schematically illustrates the de-accumulation and determination steps in the trellis de-allocation.

As each SPT term in the trellis de-allocation can be a candidate to be removed. Therefore, as shown in FIG. 8, in the k=K−1 stage, all SPT terms, $q_{-4,1}$, $q_{-4,2}$, $q_{-6,2}$, $q_{-4,3}$, $q_{-8,3}$ and $q_{7,4}$ are listed as candidates to be removed. Each SPT term in the (K−1)-th stage is linked to all other SPT terms in the K-th stage. Each link corresponds to an operation that determines the frequency response when the linked SPT term in the (K−1)-th stage is removed. Such a process is repeated until all the stage cannot satisfy filter specifications.

(Step 3-3) Determination

For each SPT term in each stage, the link that results in a best frequency response with a lowest cost is selected and the links that yield the filter specification is retained the surviving path, as shown in FIG. 8, thereby determining the redundant SPT terms.

In view of the foregoing, it is known that the present invention utilizes the MDECOR transformation to reduce the serious quantization error caused by non-uniform distribution of SPT numbers. The MDECOR compresses the magnitude of coefficients before quantizing them. Also, the present invention optimizes these coefficients by trellis de-allocation algorithm. Therefore, if one intends to implement a FIR filter by SPT multipliers but the performance cannot satisfy the specification under limited numbers of non-zero digits, it is applicable to employ the MDECOR to achieve the target precision performance, instead of using more adders in practical implementation, and then apply trellis de-allocation algorithm. Accordingly, a lower cost can be achieved in designing the multiplier-less FIR filters.

Although the present invention has been explained in relation to its preferred embodiment, it is to be understood that many other possible modifications and variations can be made without departing from the spirit and scope of the invention as hereinafter claimed.

What is claimed is:

1. A method for implementing a multiplier-less FIR filter that performs the convolution of $$H(z) = \sum_{k=0}^{N-1} h_k z^{-k},$$

where H(z) is a system transfer function of the FIR filter, $h_k$ is the k-th coefficient of the FIR filter, and x(n) and y(n) denote the input and the output signals at time instance n, respectively, the method comprising the steps of:

(A) compressing the dynamic range of the coefficients of the FIR filter by a transformation:

$$H'(z) = H(z) \frac{\prod_{i=1}^{m-1}(1+\alpha_i z^{-\beta})^m}{\prod_{i=1}^{m-1}(1+\alpha_i z^{-\beta})^m},$$

where parameters $\alpha$ and $\beta$ are chosen depending on filter type, $-1 \leq \alpha_i \leq 1$, and m denotes iteration numbers of a coefficient operation of transformation; and (B) quantizing the compressed coefficients obtained in step (A) into SPT numbers.

2. The method as claimed in claim 1, further comprising a step (C) for optimizing the coefficients by removing redundant SPT numbers.

3. The method as claimed in claim 2, wherein, in step (C), the coefficients is optimized by a trellis de-allocation method comprising the steps of:

(C1) allocating all SPT terms of the coefficients;

(C2) at a k=K−1 stage, linking each SPT term to all other SPT terms in a K-th stage, wherein each link corresponds to an operation that determines the frequency response when the linked SPT term in the (K−1)-th stage is removed;

(C3) repeating step (C2) until all the stage cannot satisfy filter specifications; and (C4) for each SPT term in the previous stage, selecting the link that results in a best frequency response and retaining the links that yield the filter specification as a surviving path, thereby determining the redundant SPT terms.

4. The method as claimed in claim 1, wherein, in step (B), the compressed coefficients are quantized into SPT numbers as follows:

$$h_i \cong \sum_{k=1}^{L} S_k 2^{-k} = D_{n-1} \Lambda \quad D_1 D_0$$

where $h_i$ denotes a compressed coefficient, $S_k \in \{-1,0,1\}$, L is the number of nonzero digits and n is the coefficient wordlength.

5. The method as claimed in claim 1, wherein $|\alpha_i| \leq 1$, $\alpha_i = -1$, and $\beta = 1$ if the filter is a low-pass filter.

6. The method as claimed in claim 1, wherein $|\alpha_i| \leq 1$, $\alpha_i = 1$ and $\beta = 1$ if the filter is a high-pass filter.

7. The method as claimed in claim 1, wherein $|\alpha_i| \leq 1$, $\alpha_i = 1$ and $\beta = \pi/\omega_c$ if the filter is a band-pass filter and $\omega_c$ denotes the central frequency of the band-pass filter.

8. The method as claimed in claim 1, $|\alpha_i| \leq 1$, $\alpha_i = -1$ and $\beta = 2$ if the filter is a band-stop filter.

9. The method as claimed in claim 1, wherein the value of $\alpha_i$ can be assigned such that it either equals or not equals the others.

* * * * *